(12) United States Patent
Pan et al.

(10) Patent No.: US 6,656,832 B1
(45) Date of Patent: Dec. 2, 2003

(54) PLASMA TREATMENT METHOD FOR FABRICATING MICROELECTRONIC FABRICATION HAVING FORMED THEREIN CONDUCTOR LAYER WITH ENHANCED ELECTRICAL PROPERTIES

(75) Inventors: Shing-Chyang Pan, Tainan (TW); Keng-Chu Lin, Ping-Tung (TW); Shwangming Jen, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/205,052

(22) Filed: Jul. 25, 2002

(51) Int. Cl.[7] .......................................... H01L 21/4763
(52) U.S. Cl. ....................... 438/627; 438/534; 438/637; 438/643; 438/653; 438/677; 438/687; 438/710; 438/714
(58) Field of Search ................... 438/627, 634, 438/637, 643, 653, 677, 687, 710, 714

(56) References Cited

U.S. PATENT DOCUMENTS

| | | |
|---|---|---|
| 4,201,579 A | 5/1980 | Robinson et al. |
| 2002/0162736 A1 * | 11/2002 | Ngo et al. .................. 438/785 |

* cited by examiner

*Primary Examiner*—John F. Niebling
*Assistant Examiner*—Lynne A. Gurley
(74) *Attorney, Agent, or Firm*—Tung & Associates

(57) ABSTRACT

A method for fabricating a microelectronic fabrication provides for forming a patterned conductor layer into a via defined by a pair of dielectric layers. Within the method, the via is plasma treated prior to forming therein the patterned conductor layer with at least one of: (1) an argon containing plasma with each of a radio frequency source power density and a radio frequency bias power density of less than about 300 watts; and (2) a hydrogen containing plasma with a radio frequency source power of greater than about 400 watts and a radio frequency bias power density of greater than about 100 watts.

7 Claims, 2 Drawing Sheets

PLASMA TREATMENT METHOD FOR FABRICATING MICROELECTRONIC FABRICATION HAVING FORMED THEREIN CONDUCTOR LAYER WITH ENHANCED ELECTRICAL PROPERTIES

BACKGROUND OF THE INVENTION

1. Field of the Invention

The present invention relates generally to methods for forming conductor layers within microelectronic fabrications. More particularly, the present invention relates to methods for forming, with enhanced electrical properties, conductor layers within microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased and patterned microelectronic conductor layer dimensions have decreased, it has become increasingly common in the art of microelectronic fabrication to form within microelectronic fabrications patterned microelectronic conductor layers of copper containing conductor materials. Patterned microelectronic conductor layers formed within microelectronic fabrications of copper containing conductor materials are desirable in the art of microelectronic fabrication insofar as patterned microelectronic conductor layers formed of copper containing conductor materials generally provide improved electrical performance in comparison with patterned microelectronic conductor layers formed of other conductor materials, such as but not limited to aluminum containing conductor materials.

While patterned microelectronic conductor layers formed of copper containing conductor materials are thus clearly desirable in the art of microelectronic fabrication, patterned microelectronic conductor layers formed of copper containing conductor materials are nonetheless not entirely without problems in the art of microelectronic fabrication. In that regard, patterned microelectronic conductor layers formed of copper containing conductor materials are often difficult to form within microelectronic fabrications with optimized and enhanced electrical properties.

It is thus desirable in the art of microelectronic fabrication to form within microelectronic fabrications patterned microelectronic conductor layers formed of copper containing conductor materials, with optimized and enhanced electrical properties.

It is towards the foregoing object that the present invention is directed.

Various methods have been disclosed in the art of microelectronic fabrication for forming microelectronic fabrications with desirable properties.

Included among the methods, but not limiting among the methods, are methods disclosed within Robinson et al., in U.S. Pat. No. 4,201,579 (a hydrogen plasma stripping method for stripping from a microelectronic fabrication a photoresist layer without oxidizing a microelectronic conductor layer formed within the microelectronic fabrication).

Desirable in the art of microelectronic fabrication are additional methods and materials which may be employed in the art of microelectronic fabrication for forming within microelectronic fabrications patterned microelectronic conductor layers with optimized and enhanced electrical properties.

It is towards the foregoing object that the present invention is directed.

SUMMARY OF THE INVENTION

A first object of the present invention is to provide a method for forming within a microelectronic fabrication a patterned microelectronic conductor layer.

A second object of the present invention is to provide a method in accord with the first object of the present invention, wherein the patterned microelectronic conductor layer is formed with optimized and enhanced electrical properties.

A third object of the present invention is to provide a method in accord with the first object of the present invention and the second object of the present invention, wherein the method is readily commercially implemented.

In accord with the objects of the present invention, the present invention provides a method for fabricating, with enhanced electrical properties, a microelectronic fabrication having formed therein a patterned microelectronic conductor layer.

To practice the method of the present invention, there is first provided a substrate. There is then formed over the substrate a first patterned conductor layer. There is then formed over the first patterned conductor layer a pair of patterned dielectric layers which defines a via which accesses the first patterned conductor layer. There is then treated the pair of patterned dielectric layers and the first patterned conductor layer exposed within the via with at least one of: (1) an argon containing plasma at a radio frequency source power and a radio frequency bias power each less than about 300 watts; and (2) a hydrogen containing plasma at a radio frequency source power of greater than about 400 watts and a radio frequency bias power of greater than about 100 watts, to form from the via a plasma treated via and form from the patterned conductor layer a plasma treated patterned conductor layer.

The present invention provides a method for forming a microelectronic fabrication having formed therein a patterned microelectronic conductor layer, wherein the patterned microelectronic conductor layer is formed with enhanced electrical properties.

The present invention realizes the foregoing objects by plasma treating sidewall and floor components of a via into which is formed the patterned microelectronic conductor layer with at least one of an argon containing plasma and a hydrogen containing plasma, with specific radio frequency source powers and radio frequency bias powers (such at to provide at least one of attenuated electrical leakage, attenuated via resistance thermal instability and attenuated resistance-capacitance delay of the patterned microelectronic conductor layer when formed into the plasma treated via.

The method of the present invention is readily commercially implemented.

The present invention employs methods and materials as are generally known in the art of microelectronic fabrication, but employed within the context at least in part of specific process limitations which provide the present invention. Since it is thus at least in part a series of specific process limitations which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for forming a microelectronic fabrication having formed therein a patterned microelectronic conductor layer, wherein the patterned microelectronic conductor layer is formed with enhanced electrical properties.

The present invention realizes the foregoing objects by plasma treating sidewall and floor components of a via into which is formed the patterned microelectronic conductor layer with at least one of an argon containing plasma and a hydrogen containing plasma, with specific radio frequency source powers and radio frequency bias powers (such at to provide attenuated electrical leakage, attenuated electrical resistance and enhanced resistance-capacitance delay of the patterned microelectronic conductor layer when formed into the plasma treated via.

Referring now to FIG. 1 to FIG. 4, there is shown a series of schematic cross-sectional diagrams illustrating the results of progressive stages of fabricating, in accord with a preferred embodiment of the present invention, a microelectronic fabrication having formed therein a conductor layer in accord with the present invention.

Figure 1:
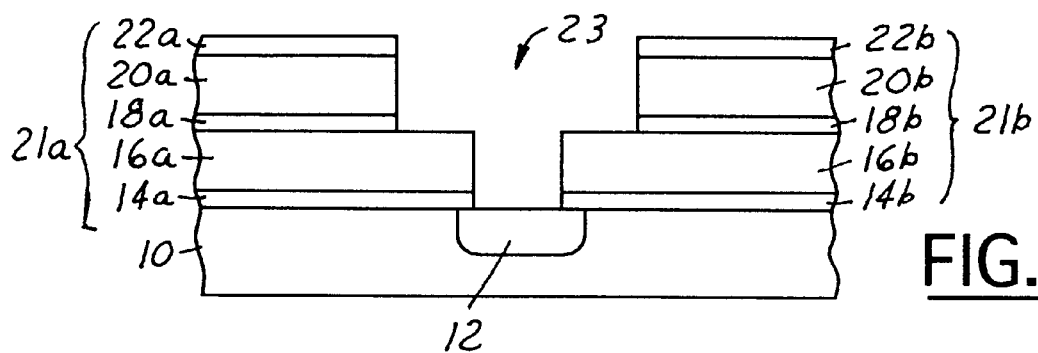
FIG. 1, FIG. 2, FIG. 3 and FIG. 4 show a series of schematic cross-sectional diagrams illustrating the results of progressive stages of forming, in accord with a preferred embodiment of the present invention, a microelectronic fabrication having formed therein a patterned conductor layer in accord with the present invention.

Shown in FIG. 1 is a schematic cross-sectional diagram of the microelectronic fabrication at an early stage in its fabrication in accord with the preferred embodiment of the present invention.

Shown in FIG. 1, in a first instance, in a substrate 10 having formed therein a conductor contact region 12.

Within the preferred embodiment of the present invention with respect to the substrate 10, the substrate 10 may be employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Although not specifically illustrated within the schematic cross-sectional diagram of FIG. 1, the substrate 10 may consist of a substrate alone as employed within the microelectronic fabrication, or in an alternative, the substrate 10 may comprise a substrate as employed within the microelectronic fabrication, where the substrate has formed thereupon and/or thereover any of several additional microelectronic layers as are conventionally employed within the microelectronic fabrication within which is employed the substrate. Similarly with the substrate alone as employed within the microelectronic fabrication, such additional microelectronic layers may be formed from microelectronic materials selected from the group including but not limited to microelectronic conductor materials, microelectronic semiconductor materials and microelectronic dielectric materials.

Similarly, and although also not specifically illustrated within the schematic cross-sectional diagram of FIG. 1, typically and preferably, but not exclusively, when the substrate 10 consists of or comprises a semiconductor substrate as employed within a semiconductor integrated circuit microelectronic fabrication, has formed therein and/or thereupon microelectronic devices as are conventional within the microelectronic fabrication within which is employed the substrate. Such microelectronic devices may be selected from the group including but not limited to resistors, transistors, diodes and capacitors.

Within the preferred embodiment of the present invention with respect to the conductor contact region 12, and while the conductor contact region 12 is typically and preferably either: (1) a doped semiconductor substrate conductor contact region (having a dopant concentration of greater than about 1E20 dopant atoms per cubic centimeter) under circumstances where the substrate 10 consists of or comprises a semiconductor substrate; or (2) a metal conductor contact region under circumstances where the substrate is employed within any of the above enumerated microelectronic fabrications, the present invention provides particular value under circumstances where the conductor contact region 12 is formed of a copper containing conductor material, such as but not limited to copper or a copper alloy of greater than about 90 weight percent copper.

Shown also within the schematic cross-sectional diagram of FIG. 1, and formed successively upon or over the substrate 10 having formed therein the conductor contact region 12, is a series of patterned layers comprising: (1) a pair of patterned dielectric barrier layers 14a and 14b formed upon the substrate 10 having formed therein the conductor contact region 12; (2) a pair of patterned first inter-metal dielectric layers 16a and 16b formed aligned upon the pair of patterned dielectric barrier layers 14a and 14b; (3) a pair of patterned etch stop layers 18a and 18b formed upon the pair of patterned first inter-metal dielectric layers 16a and 16b and further separated than the pair of patterned first inter-metal dielectric layers 16a and 16b; (4) a pair of patterned second inter-metal dielectric layers 20a and 20b formed aligned upon the pair of patterned etch stop layers 18a and 18b; and (5) a pair of patterned planarizing stop layers 22a and 22b formed aligned upon the pair of patterned second inter-metal dielectric (IMD) layers 20a and 20b. Within FIG. 1, the pair of patterned dielectric barrier layers 14a and 14b may also have etch stop properties.

Within the preferred embodiment of the present invention with respect to the pair of patterned dielectric barrier layers 14a and 14b, the pair of patterned etch stop layers 18a and 18b and the pair of patterned planarizing stop layers 22a and 22b, each of the pair of patterned dielectric barrier layers 14a and 14b, the pair of patterned etch stop layers 18a and 18b and the pair of patterned planarizing stop layers 22a and 22b is typically and preferably formed of a dense dielectric material, such as but not limited to a dense silicon nitride dielectric material, a dense silicon oxynitride dielectric material or a dense silicon carbide dielectric material, although the pair of patterned planarizing stop layers 22a and 22b is generally formed of a different material than the pair of patterned dielectric barrier layers 14a and 14b and the pair of patterned etch stop layers 18a and 18b.

Typically and preferably: (1) the pair of patterned dielectric barrier layers 14a and 14b is formed of a silicon carbide dielectric material or a silicon nitride dielectric material formed to a thickness of from about 300 to about 600 angstroms; (2) the pair of patterned etch stop layers 18a and 18b is formed of a silicon carbide dielectric material or a silicon nitride dielectric material formed to a thickness of from about 300 to about 600 angstroms; and (3) the pair of patterned planarizing stop layers 22a and 22b is formed of a silicon oxynitride dielectric material formed to a thickness of from about 300 to about 1800 angstroms.

Within the preferred embodiment of the present invention with respect to the pair of patterned first inter-metal dielectric (IMD) layers 16a and 16b and the pair of patterned second inter-metal dielectric layers 20a and 20b, each of the pair of patterned first inter-metal dielectric layers 16a and 16b and the pair of patterned second inter-metal dielectric layers 20a and 20b may be formed from any of several types of dielectric materials as are conventional in the art of microelectronic fabrication, including but not limited to generally higher dielectric constant silicon oxide dielectric materials (having a dielectric constant of from about 4.0 to about 5.0) and generally lower dielectric constant dielectric materials (having a dielectric constant of from about 2.0 to about 4.0) such as but not limited to spin-on-glass (SOG) dielectric materials, spin-on-polymer (SOP) dielectric materials, amorphous carbon dielectric materials and fluorosilicate glass (FSG) dielectric materials. More typically and preferably, each of the pair of patterned first inter-metal dielectric (IMD) layers 16a and 16b and the pair of patterned second inter-metal dielectric (IMD) layers 20a and 20b is formed of a low dielectric constant dielectric material.

Typically and preferably, each of the pair of patterned first dielectric layers 16a and 16b is formed to a thickness of from about 3500 to about 4500 angstroms and each of the pair of patterned second inter-metal dielectric (IMD) layers 20a and 20b is formed to a thickness of from about 3500 to about 4500 angstroms.

As is understood by a person skilled in the art, the foregoing series of patterned layers provides within the microelectronic fabrication whose schematic cross-sectional diagram is illustrated in FIG. 1 a pair of patterned composite dielectric layers 21a and 21b which define a dual damascene aperture 23. The dual damascene aperture 23 in turn comprises a via defined by the pair of patterned dielectric barrier layers 14a and 14b and the pair of patterned first inter-metal dielectric layers 16a and 16b, the via being overlapped by a trench of greater linewidth as defined by the pair of patterned etch stop layers 18a and 18b, the pair of patterned second inter-metal dielectric (IMD) layers 20a and 20b and the pair of patterned planarizing stop layers 22a and 22b. The present invention is not, however, limited to forming patterned conductor layers, and in particular patterned copper containing conductor layers, into only dual damascene apertures.

Figure 2:
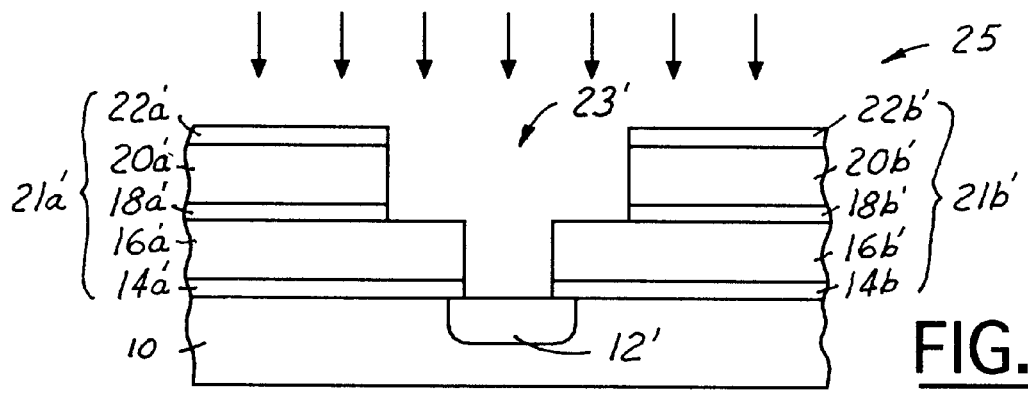

Referring now to FIG. 2, there is shown a schematic cross-sectional diagram illustrating the results of further processing of the microelectronic fabrication whose schematic cross-sectional diagram is illustrated in FIG. 1.

Shown in FIG. 2 is a schematic cross-sectional diagram of a microelectronic fabrication otherwise equivalent to the microelectronic fabrication whose schematic cross-sectional diagram is illustrated in FIG. 1, but wherein each of the series of patterned layers as illustrated within the schematic cross-sectional diagram of FIG. 1, as well as the conductor contact region 12, has been treated with at least one treatment plasma 25 to form therefrom a series of plasma treated patterned layers and a plasma treated conductor contact region comprising: (1) a plasma treated conductor contact. region 12'; (2) a pair of plasma treated patterned dielectric barrier layers 14a' and 14b'; (3) a pair of plasma treated patterned first inter-metal dielectric (IMD) layers 16a' and 16b'; (4) a pair of plasma treated patterned etch stop layers 18a' and 18b'; (5) a pair of plasma treated patterned second inter-metal dielectric (IMD) layers 20a' and 20b'; and (6) a pair of plasma treated patterned planarizing stop layers 22a' and 22b'.

Within the preferred embodiment of the present invention, the treatment plasma 25 comprises (with respect to at least an eight inch diameter and a twelve inch diameter substrate) at least one of (and preferably both of): (1) an argon containing treatment plasma having each of a radio frequency source power and a radio frequency bias power of less than about 300 watts (more preferably less than about 250 watts and most preferably less than about 200 watts); and (2) a hydrogen containing treatment plasma having a radio frequency source power of greater than about 400 watts (more preferably greater than about 500 watts and most preferably greater than about, 600 watts) and a bias power of greater than about 100 watts (more preferably greater than about 250 watts and most preferably greater than about 450 watts). Preferably, the treatment plasma 25 comprises a hydrogen containing treatment plasma followed by an argon containing treatment plasma in accord with the above power limitations.

Within the preferred embodiment of the present invention with respect to the treatment plasma 25 when provided as the argon containing treatment plasma, the treatment plasma 25 when provided as the argon containing treatment plasma also employs: (1) a reactor chamber pressure of from about 0.2 to about 5 mtorr; (2) a substrate temperature of from about 100 to about 400 degrees centigrade; (3) an argon flow rate of from about 3 to about 10 standard cubic centimeters per minute (sccm); and (4) a treatment time of from about 8 to about 15 seconds.

Within the preferred embodiment of the present invention with respect to the first treatment plasma 25 when provided as the hydrogen containing treatment plasma, the first treatment plasma 25 when provided as the hydrogen containing treatment plasma also employs: (1) a reactor chamber pressure of from about 30 to about 100 mtorr; (2) a substrate temperature of from about 100 to about 400 degrees centigrade; (3) a molecular hydrogen concentration of from about 5 to about 10 volume percent within a helium carrier gas at a total flow rate of from about 50 to about 150 standard cubic centimeters per minute (sccm); and (4) a plasma treatment time of from about 20 to about 80 seconds.

Within the present invention and the preferred embodiment of the present invention, it is believed that either or both of: (1) the argon containing treatment plasma at the comparatively low and limited radio frequency source power and radio frequency bias power; and (2) the hydrogen containing treatment plasma at the comparatively high radio frequency source power and radio frequency bias power, provide for optimal cleaning of the conductor contact region 12 in particular when formed of a copper containing conductor material (i.e., including copper oxide removal), such as to in turn provide for enhanced via resistance thermal stability and attenuated electrical leakage for a patterned copper containing conductor layer formed within the plasma treated dual damascene aperture 23'. It is also believed that the first treatment plasma 25 in particular when provided as the hydrogen containing treatment plasma treats the pair of patterned composite dielectric layers 21a and 21b such as to provide the pair of plasma treated patterned composite dielectric layers 21a' and 21b' which provide enhanced resistance-capacitance delay properties with respect to a patterned conductor layer formed into the plasma treated dual damascene aperture 23'.

Figure 3:
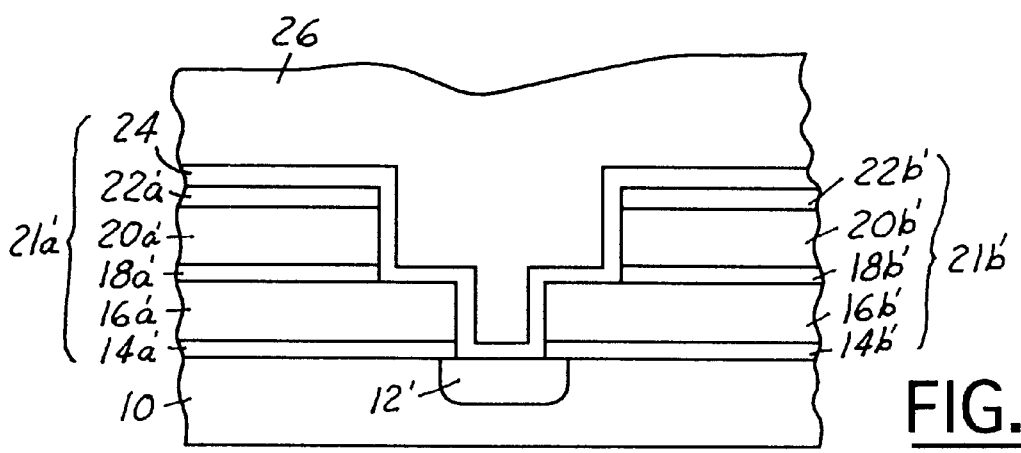

Referring now to FIG. 3, there is shown a schematic cross-sectional diagram illustrating the results of further processing of the microelectronic fabrication whose schematic cross-sectional diagram is illustrated in FIG. 2.

Shown in FIG. 3 is a schematic cross-sectional diagram of a microelectronic fabrication otherwise equivalent to the microelectronic fabrication whose schematic cross-sectional diagram is illustrated in FIG. 2, but wherein there is formed conformally upon exposed surfaces of the foregoing series of plasma treated patterned layers which comprise the plasma treated patterned composite dielectric layers 21a' and 21b', and within the plasma treated dual damascene aperture 23', while also contacting the plasma treated conductor contact region 12', a blanket conductor barrier layer 24. Finally, there is also shown within the schematic cross-sectional diagram of FIG. 1, and formed upon the blanket conductor barrier layer 24, a blanket conductor layer 26.

Within the present invention and the preferred embodiment of the present invention, the blanket conductor barrier layer 24 may be formed of conductor barrier materials as are otherwise generally conventional in the art of microelectronic fabrication, including in particular refractory metal and refractory metal nitride conductor barrier materials. Typically and preferably, the blanket conductor barrier layer 24 is formed to a thickness of from about 200 to about 500 angstroms from a refractory metal or refractory metal nitride barrier material. Within the preferred embodiment of the present invention with respect to the blanket conductor layer 26, and although the blanket conductor layer 26 may be formed from any of several conductor materials as are conventional in the art of microelectronic fabrication, including but not limited to aluminum, aluminum alloys, copper and copper alloys, the present invention provides particular value under circumstances where the blanket conductor layer 26 is formed of a copper or copper alloy (having a copper content of greater than about 90 weight percent) copper containing conductor material. Typically and preferably, the blanket conductor layer 26 is formed to a thickness of from about 7000 to about 9000 angstroms.

Figure 4:
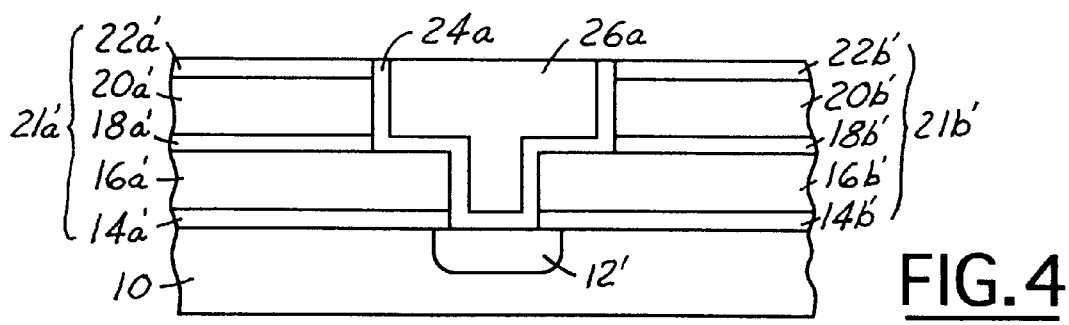

Referring now to FIG. 4, there is shown a schematic cross-sectional diagram illustrating the results of further processing of the microelectronic fabrication whose schematic cross-sectional diagram is illustrated in FIG. 3.

Shown in FIG. 4 is a schematic cross-sectional diagram of a microelectronic fabrication otherwise equivalent to the microelectronic fabrication whose schematic cross-sectional diagram is illustrated in FIG. 3, but wherein the blanket conductor barrier layer 24 and the blanket conductor layer 26 have been planarized to form within the plasma treated dual damascene aperture 23' a patterned conductor barrier layer 24a having formed thereupon a patterned contiguous conductor interconnect and conductor stud layer 26a. Under certain circumstances, the pair of patterned planarizing stop layers 22a and 22b may also be planarized and removed.

Within the preferred embodiment of the present invention, the blanket conductor barrier layer 24 and the blanket conductor layer 26 may be planarized to form the patterned conductor barrier layer 24a and the patterned contiguous conductor interconnect and conductor stud layer 26a while employing planarizing methods as are conventional in the art of microelectronic fabrication, including in particular chemical mechanical polish (CMP) polish planarizing methods.

FIG. 4 illustrates a microelectronic fabrication fabricated in accord with the preferred embodiment of the present invention. The microelectronic fabrication has formed therein a patterned conductor layer with enhanced performance insofar as a via into which is formed the patterned conductor layer is plasma treated under certain plasma power limitations.

EXAMPLES

In order to illustrate the value of the present invention, there was prepared three series of microelectronic fabrications generally in accord with the microelectronic fabrication whose schematic cross-sectional diagram is illustrated in FIG. 2, where the three series of microelectronic fabrications employed eight inch diameter substrates treated with three different first treatment plasmas in accord with the first treatment plasma 25 as illustrated within the schematic cross-sectional diagram of FIG. 2.

A first of the three treatment plasmas employed a 5 percent hydrogen in helium treatment plasma at: (1) a reactor chamber pressure of about 80 mtorr; (2) a radio frequency source power of about 500 watts; (3) a radio frequency bias power density of about 400 watts per square centimeter substrate area; (4) a substrate temperature of about 350 degrees centigrade; (5) a 5 percent hydrogen in helium flow rate of about 100 standard cubic centimeters per minute (sccm); and (6) a treatment time of about 60 seconds.

A second of the three treatment plasmas employed a hydrogen treatment plasma followed by an argon treatment plasma. The hydrogen treatment plasma employed: (1) a reactor chamber pressure of about 80 mtorr; (2) a radio frequency source power of about 500 watts; (3) a radio frequency bias power of about 250 watts; (4) a substrate temperature of about 350 degrees centigrade; (5) a 5 percent hydrogen in helium flow rate of about 100 standard cubic centimeters per minute (sccm); and (6) a treatment time of about 40 seconds. The argon treatment plasma employed: (1) a reactor chamber pressure of about 0.3 mtorr; (2) a comparatively low radio frequency source power of about 200 watts; (3) a comparatively low radio frequency bias power of about 250 watts; (4) a substrate temperature of about 350 degrees centigrade; (5) an argon flow rate of about 5 standard cubic centimeters per minute sccm); and (6) a treatment time of about 10 seconds.

A third of the three treatment plasmas employed a hydrogen treatment plasma followed by an argon treatment plasma. The hydrogen treatment plasma employed: (1) a reactor chamber pressure of about 80 mtorr; (2) a radio frequency source power of about 450 watts and a radio frequency bias power of about 10 watts; (3) a substrate temperature of about 350 degrees centigrade; (4) a 5 percent hydrogen in helium flow rate of about 100 standard cubic centimeters per minute (sccm); and (5) a treatment time of about 60 seconds. The argon treatment plasma employed: (1) a reactor chamber pressure of about 0.3 mtorr; (2) a comparatively high radio frequency source power of about 340 watts; (3) a comparatively high radio frequency bias power density of about 440 watts; (4) a substrate temperature of about 350 degrees centigrade; (5) an argon flow rate of about 5 standard cubic centimeters per minute sccm); and (6) a treatment time of about 10 seconds.

The three series of microelectronic fabrications were further fabricated to form a microelectronic fabrication in accord with the schematic cross-sectional diagram of FIG. 4. Resistance-capacitance delay properties were then measured for each of the series of microelectronic fabrications. The results of the resistance-capacitance delay property measurements are reported in Table I

TABLE I

| Plasma Treatment | R/C Delay (seconds) |
| --- | --- |
| High Power $H_2$ Only | 1.157E-13 |
| High Power $H_2$ + Low Power Ar | 1.160E-13 |
| High Power $H_2$ + High Power Ar | 1.223E-13 |

As is seen from review of the data in Table I, a higher power density hydrogen containing plasma treatment, with or without a lower power density argon containing plasma treatment, provides within a microelectronic fabrication fabricated in accord with the present invention enhanced resistance/capacitance delay properties in comparison with a comparatively high power argon containing plasma treatment of the microelectronic fabrication preceded by a comparatively high power hydrogen containing plasma treatment.

In order to further illustrate the value of the present invention, there was prepared five additional series of microelectronic fabrications generally in accord with the microelectronic fabrication whose schematic cross-sectional diagram is illustrated in FIG. 1 and treated with five different treatment plasmas in accord with the treatment plasma 25 of FIG. 2. The five different treatment plasmas were predicated upon a hydrogen containing treatment plasma followed by an argon containing treatment plasma in accord with the above hydrogen containing treatment plasma and argon containing treatment plasma, but with varying and reciprocal radio frequency bias powers within both the hydrogen containing treatment plasma and the argon containing treatment plasma. The hydrogen containing treatment plasma:argon containing treatment plasma radio frequency/bias power ratios were: (1) 450/10W:340/440W; (2) 500/150W:200/300W; (3) 500/250W:200/250W; (4) 500/400W:200/200W; and (5) 500/450:0W, for treatment of eight inch diameter (i.e., 200 millimeter) substrates.

The five series of plasma treated microelectronic fabrications were then fabricated to completion in accord with the microelectronic fabrication whose schematic cross-sectional diagram is illustrated in FIG. 4.

Leakage current measurements and via resistance incremental thermal stress measurements were then obtained for various of the above five series of microelectronic fabrications.

Figure 6:
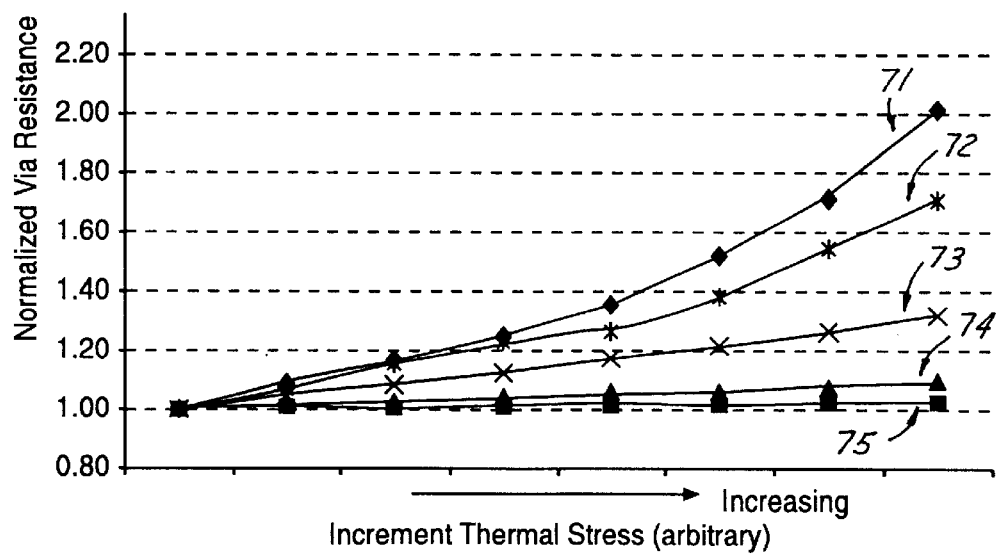
FIG. 6 shows a graph of Normalized Via Resistance versus Incremental Thermal Stress for a series of microelectronic fabrications formed in accord with the present invention and not in accord with the present invention.

Results for leakage current measurements are shown in the graph of FIG. 6, where: (1) the series of data points which corresponds with reference numeral 60 corresponds with the series of microelectronic fabrications having the hydrogen containing treatment plasma:argon containing treatment plasma radio frequency/bias power ratio of 450/10W:340/440W; (2) the series of data points which correspond with reference numeral 62 corresponds with the series of microelectronic fabrications having the hydrogen containing treatment plasma:argon containing treatment plasma radio frequency/bias power ratio of 500/250W:200/250W; and (3) the series of data points which corresponds with reference numeral 64 correspond with the series of microelectronic fabrications having the hydrogen containing treatment plasma:argon containing treatment plasma radio frequency/bias power ratio of 500/450W:0W.

Results for via resistance incremental thermal stress measurements are shown within the graph of FIG. 7, where the lines which correspond with reference numerals 71, 72, 73, 74 and 75 correspond with the hydrogen containing treatment plasma:argon containing treatment plasma bias power ratios (1), (2), (3), (4) and (5) as designated above.

Figure 5:
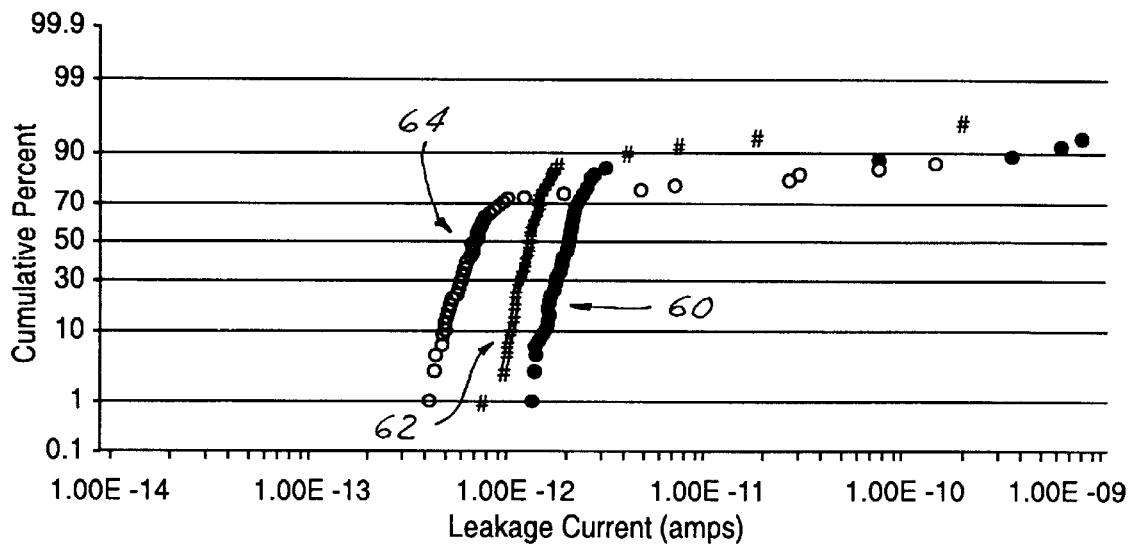
FIG. 5 shows a graph of Cumulative Percent versus Leakage Current for a series of microelectronic fabrications formed in accord with the present invention and not in accord with the present invention.

As is seen from review of the data within FIG. 5 and FIG. 6, an enhanced hydrogen containing treatment plasma bias power and a reduced argon containing treatment plasma bias power provide microelectronic fabrications within which there may be formed patterned copper containing conductor layers with reduced leakage currents and reduced via resistance thermal stress induced increases.

As is understood by a person skilled in the art, the preferred embodiment and examples of the present invention are illustrative of the present invention rather than limiting of the present invention. Revisions and modifications may be made to methods, materials, structures and dimensions employed for fabricating a microelectronic fabrication in accord with the preferred embodiment and examples of the present invention while still providing a method for fabricating a microelectronic fabrication in accord with the present invention, further in accord with the accompanying claims.

What is claimed is:

1. A method for fabricating a microelectronic fabrication comprising:

providing a substrate;

forming on the substrate a first patterned conductor layer;

forming over the first patterned conductor layer a pair of patterned dielectric layers which defines a via which accesses the first patterned conductor layer;

treating the pair of patterned dielectric layers and the first patterned conductor layer exposed within the via with a hydrogen containing plasma having a radio frequency source power of greater than about 600 watts, to form a plasma treated via and a plasma treated first patterned conductor layer.

2. The method of claim 1 wherein the substrate is employed within a microelectronic fabrication selected from the group consisting of integrated circuit microelectronic fabrications, ceramic substrate microelectronic fabrications, solar cell optoelectronic microelelctronic fabrications, sensor image array optoelectronic microelectronic fabrications and display image optoelectronic microelectronic fabrications.

3. The method of claim 1 wherein the first patterned conductor layer is formed from a conductor material selected from the group consisting of silicon containing conductor materials, aluminum containing conductor materials and copper containing conductor materials.

4. The method of claim 1 wherein the first patterned conductor layer is formed from a copper containing conductor material.

5. The method of claim 1 further comprising forming into the plasma treated via a second patterned conductor layer.

6. The method of claim 5 wherein the second patterned conductor layer is formed of a copper containing conductor material.

7. The method of claim 1 wherein the pair of patterned dielectric layers and the first patterned conductor layer exposed within the via are treated the hydrogen containing plasma followed by an argon containing plasma.

* * * * *